(12) United States Patent
Nakazawa et al.

(10) Patent No.: US 11,551,935 B2
(45) Date of Patent: Jan. 10, 2023

(54) SUBSTRATE PROCESSING METHOD AND SUBSTRATE PROCESSING APPARATUS

(71) Applicant: Tokyo Electron Limited, Tokyo (JP)

(72) Inventors: Takashi Nakazawa, Kumamoto (JP); Kazuyoshi Shinohara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/826,504

(22) Filed: Mar. 23, 2020

(65) Prior Publication Data
US 2020/0321217 A1  Oct. 8, 2020

(30) Foreign Application Priority Data

Apr. 4, 2019  (JP) ................ JP2019-071918

(51) Int. Cl.
*H01L 21/3213* (2006.01)
*H01L 21/306* (2006.01)
*H01L 21/67* (2006.01)

(52) U.S. Cl.
CPC .... *H01L 21/30604* (2013.01); *H01L 21/6708* (2013.01)

(58) Field of Classification Search
CPC ......... H01L 21/02041; H01L 21/02019; H01L 21/30604
See application file for complete search history.

(56) References Cited

U.S. PATENT DOCUMENTS

| 6,632,292 | B1 * | 10/2003 | Aegerter | C23F 1/18 134/2 |
| 2009/0032498 | A1 * | 2/2009 | Tsuchiya | H01L 21/6708 216/92 |
| 2013/0074872 | A1 * | 3/2013 | Yeh | H01L 21/67051 134/6 |

FOREIGN PATENT DOCUMENTS

JP        2018-107455 A      7/2018

\* cited by examiner

*Primary Examiner* — Thomas T Pham
(74) *Attorney, Agent, or Firm* — Venjuris, P.C.

(57) ABSTRACT

A substrate processing method includes: holding a substrate having a processing target surface and an opposite surface which is opposite to the processing target surface; preheating a center portion of the opposite surface of the substrate; after the preheating, ejecting a sulfuric acid hydrogen peroxide mixture (SPM) to a peripheral edge portion of the processing target surface of the substrate; and after the ejecting, moving an ejection position of the SPM from the peripheral edge portion of the processing target surface to a center portion of the substrate.

5 Claims, 7 Drawing Sheets

| SURFACE EJECTION POSITION | TEMPERATURE OF PERIPHERAL EDGE PORTION | TARGET TEMPERATURE OF BACK SURFACE SPM | MIXING RATIO OF BACK SURFACE SPM (H2SO4:H2O2) |
|---|---|---|---|
| 140mm | 130°C | 130°C | X1 : Y1 |
| ⋮ | ⋮ | ⋮ | ⋮ |
| 80mm | 128°C | 128°C | X2 : Y2 |
| ⋮ | ⋮ | ⋮ | ⋮ |
| 0mm | 126°C | 126°C | X3 : Y3 |

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2019-071918 filed on Apr. 4, 2019 with the Japan Patent Office, the disclosure of which is incorporated herein in its entirety by reference.

TECHNICAL FIELD

The present disclosure relates to a substrate processing method and a substrate processing apparatus.

BACKGROUND

In the related art, there is known a technique that processes a substrate such as a semiconductor wafer or a glass substrate using an SPM that is a mixed solution of sulfuric acid and hydrogen peroxide (see, e.g., Japanese Patent Laid-Open Publication No. 2018-107455). According to the technique, the substrate may be processed using the reaction heat generated by the reaction between sulfuric acid and hydrogen peroxide.

SUMMARY

A substrate processing method according to an aspect of the present disclosure includes a holding processing, a preheating processing, an ejecting processing, and a moving processing. In the holding processing, a substrate is held. In the preheating processing, a center portion of an opposite surface which is opposite to a processing target surface of the substrate. In the ejecting processing, after the preheating processing, a sulfuric acid hydrogen peroxide mixture (SPM) is ejected to a peripheral edge portion of the processing target surface. In the moving processing, after the ejecting, an SPM ejection position is moved from the peripheral edge portion of the processing target surface to a center portion thereof.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
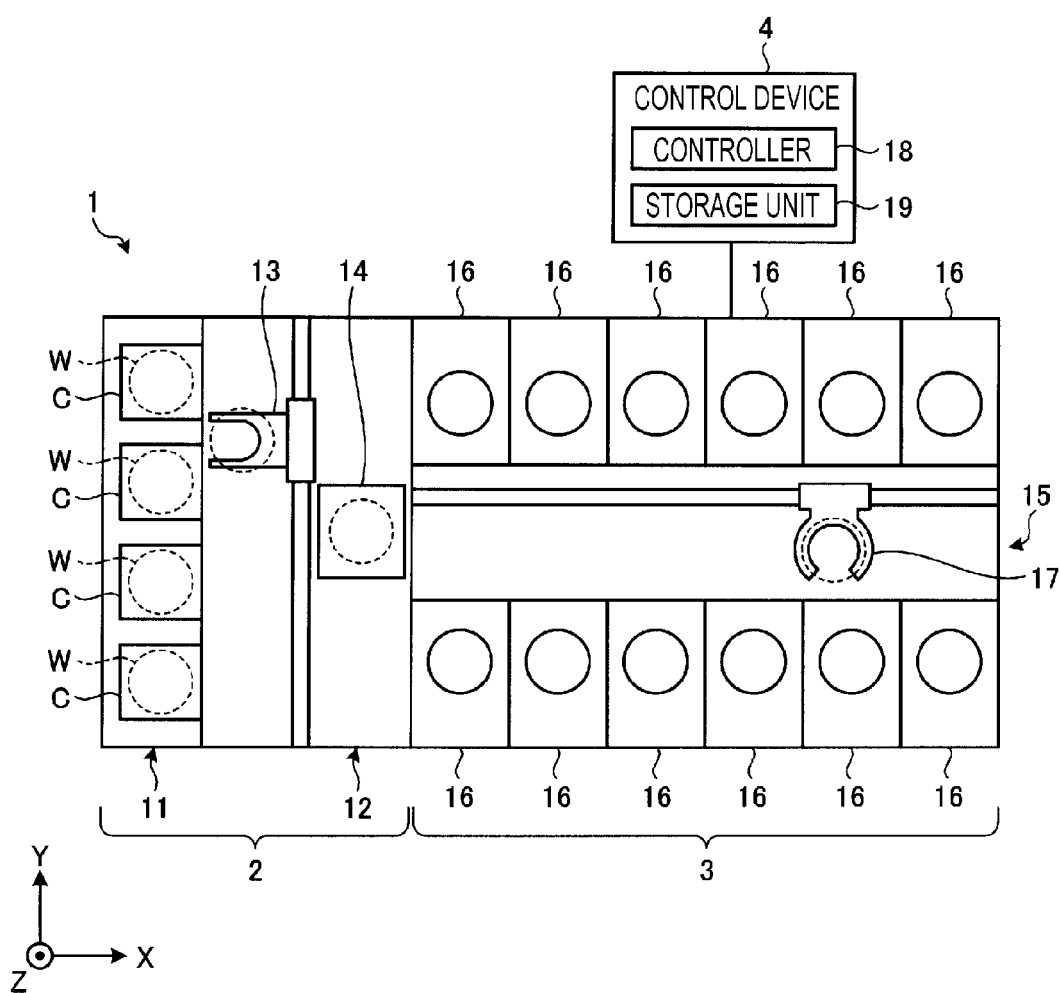
FIG. 1 is a view illustrating a configuration of a substrate processing system according to a first embodiment.

In the following detailed description, reference is made to the accompanying drawing, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, exemplary embodiments (hereinafter, referred to as "embodiments") for implementing a substrate processing method and a substrate processing apparatus according to the present disclosure will be described in detail with reference to the drawings. The substrate processing method and the substrate processing apparatus according to the present disclosure is not limited to the embodiments. In addition, respective embodiments may be appropriately combined within a range that does not contradict the processing contents. Further, in the following embodiments, the same portions are denoted by the same reference numerals, and redundant description will be omitted.

Further, in the respective drawings referred to below, for easy understanding, the X-axis, the Y-axis, and the Z-axis which are orthogonal to each other will be defined, and an orthogonal coordinate system in which the positive Z-axis direction is regarded as a vertically upward direction may be illustrated. Further, a rotation direction about the vertical axis as a rotation center may be referred to as a "0 direction."

First Embodiment

[Substrate Processing System]

FIG. 1 is a view illustrating a configuration of a substrate processing system according to a first embodiment. As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a substrate holding mechanism configured to hold the wafer W. Further, the substrate transfer device 13 is movable horizontally and vertically and pivotable around a vertical axis, and transfers the wafers W between the carriers C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a substrate holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the substrate holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

[Configuration of Processing Unit]

Figure 2:
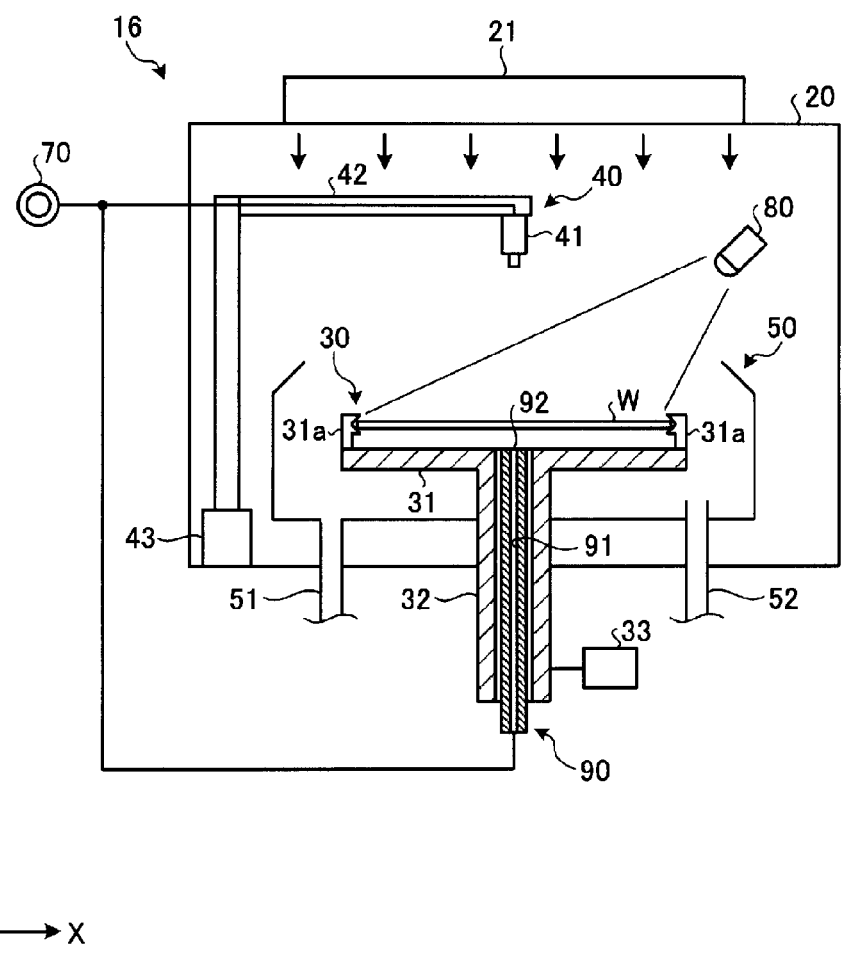
FIG. 2 is a view illustrating a configuration of a processing unit according to a first embodiment.

Next, descriptions will be made on a configuration of the processing unit 16 with reference to FIG. 2. FIG. 2 is a view illustrating a configuration of the processing unit 16 according to the first embodiment.

The processing unit 16 illustrated in FIG. 2 supplies a sulfuric acid hydrogen peroxide mixture (SPM) that is a mixed solution of sulfuric acid and hydrogen peroxide to the surface (front surface) of the wafer W, and, for example, a film formed on the surface of the wafer W is removed.

With the processing unit 16, the wafer W may be processed using the strong oxidizing power of Caro's acid contained in the SPM, and the reaction heat between sulfuric acid and hydrogen peroxide. Caro's acid ($H_2SO_5$) is generated according to a reaction formula "$H_2SO_4 + H_2O_2 \rightarrow H_2SO_5 + H_2O$," and the reaction heat between sulfuric acid and hydrogen peroxide is generated in the process of generating Caro's acid.

As illustrated in FIG. 2, the processing unit 16 is provided with a chamber 20, a substrate holding mechanism 30, a surface supply 40, a recovery cup 50, a temperature sensor 80, an SPM supply unit 70, and a back surface supply 90.

The chamber 20 accommodates the substrate holding mechanism 30, the surface supply 40, the recovery cup 50, the temperature sensor 80, and the back surface supply 90. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. Specifically, the holding unit 31 is provided with a plurality of grasping units 31a, and grasps the peripheral edge portions of the wafer W using the plurality of grasping units 31a. The support unit 32 extends in a vertical direction, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and thus, the wafer W held in the holding unit 31 is rotated.

The surface supply 40 supplies the SPM to the wafer W. Specifically, the surface supply 40 includes a nozzle 41 that is disposed above the wafer W, an arm 42 that supports the nozzle 41, and a moving mechanism 43 that moves the arm 42. The nozzle 41 is connected to the SPM supply unit 70 (will be described later), and ejects the SPM supplied from the SPM supply unit 70 to the surface of the wafer W.

The recovery cup 50 is disposed to surround the holding unit 31, and collects the SPM scattered from the wafer W by the rotation of the holding unit 31. A drain port 51 is formed on the bottom of the recovery cup 50, and the SPM collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

The temperature sensor 80 is disposed above the wafer W, and acquires temperature information of the SPM on the wafer W.

The temperature sensor 80 irradiates infrared light as irradiation light. Further, the temperature sensor 80 receives light reflected from the surface of the wafer W. Since the component reflected on the SPM existing on the wafer W is dominant in the reflected light received by the temperature sensor 80, the intensity of the reflected light may be handled as SPM information.

The temperature sensor 80 converts the intensity value of the received reflected light, and acquires a temperature distribution regarding a plane region including the wafer W as temperature information. The acquired temperature information is continuously sent to the controller 18 at predetermined time intervals (e.g., one second). The controller 18 receives the temperature information sent from the temperature sensor 80, and accumulates it in the storage unit 19.

The back surface supply 90 is disposed, for example, in a hollow that penetrates vertically the holding unit 31 and the support unit 32. A flow path 91 extending in the vertical direction is formed inside the back surface supply 90, and the SPM supply mechanism 70 is connected to the flow path 91. The back surface supply 90 ejects the SPM supplied from the SPM supply mechanism 70 toward the back surface of the wafer W from an ejection port 92 provided at the tip of the flow path 91.

[Configuration of SPM Supply Mechanism]

Subsequently, descriptions will be made on a configuration of the SPM supply mechanism 70 with reference to FIG.

Figure 3:
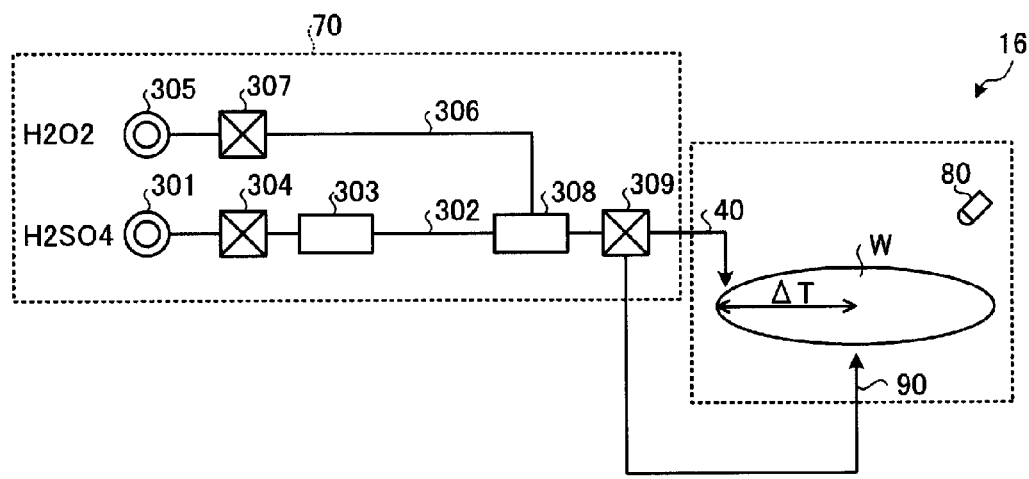
FIG. 3 is a view illustrating a configuration of an SPM supply mechanism according to a first embodiment.

3. FIG. 3 is a view illustrating the configuration of the SPM supply mechanism according to the first embodiment.

As illustrated in FIG. 3, the SPM supply mechanism 70 includes a sulfuric acid supply source 301, a sulfuric acid supply path 302, a temperature adjusting unit 303, and a valve 304 as a sulfuric acid ($H_2SO_4$) supply system. The sulfuric acid supply source 301 supplies sulfuric acid at normal temperature (room temperature). The sulfuric acid supply path 302 connects the sulfuric acid supply source 301 and a mixing unit 308 (will be described later). The temperature adjusting unit 303 is, for example, a heater, and heats the sulfuric acid flowing through the sulfuric acid supply path 302. The valve 304 opens/closes the sulfuric acid supply path 302. The temperature adjusting unit 303 may include coolnics having a cooling function.

Further, the SPM supply mechanism 70 includes a hydrogen peroxide supply source 305, a hydrogen peroxide supply path 306, and a valve 307 as a hydrogen peroxide ($H_2O_2$) supply system. The hydrogen peroxide supply source 305 supplies hydrogen peroxide at normal temperature (room temperature). The hydrogen peroxide supply path 306 connects the hydrogen peroxide supply source 305 and the mixing unit 308 (will be described later), and the hydrogen peroxide supplied from the hydrogen peroxide supply source 305 is flowing therethrough. The valve 307 opens/closes the hydrogen peroxide supply path 306.

Further, the SPM supply mechanism 70 includes the mixing unit 308 and a converting unit 309. The mixing unit 308 mixes the sulfuric acid supplied from the sulfuric acid supply path 302 and the hydrogen peroxide supplied from the hydrogen peroxide supply path 306 with a predetermined mixing ratio to generate the SPM that is a mixed solution. The generated SPM is supplied to the surface supply 40 or to the back surface supply 90 through the converting unit 309. The mixing unit 308 has a function of changing the mixing ratio according to the instruction from the controller 18.

The converting unit 309 converts the flowing-out destination of the SPM generated in the mixing unit 308. Specifically, the converting unit 309 may cause the SPM to flow out to one of the surface supply 40 and the back surface supply 90, or to both the surface supply 40 and the back surface supply 90.

[Regarding Flapping of Wafer]

In a wet processing in which a substrate is processed using a chemical liquid such as SPM, from the viewpoint of, for example, improving in-plane uniformity, a so-called scan-in operation in which the ejection position of the chemical liquid is moved from the peripheral edge portion of the substrate toward the center portion thereof is desirable. However, when ejecting the SPM that reaches a high temperature (about 100° C. to 150° C.) by the reaction heat between sulfuric acid and hydrogen peroxide to the peripheral edge portion of the substrate, the peripheral edge portion of the substrate extends due to thermal expansion, and the substrate having the peripheral edge portion grasped by the grasping units 31a is entirely bent. As a result, flapping occurs in the rotating substrate. When flapping occurs in the substrate, for example, the grasped portion of the substrate may be damaged. Further, the grasping units that grasp the substrate may be chipped, and due to the chipping of the grasping units, the substrate may be fallen down and the processing may be interrupted. Further, due to fluttering of the substrate, it is difficult to supply uniformly the chemical liquid to the surface of the substrate, and thus, the in-plane uniformity of the wet processing may be impaired. As a result, in the current situation, a scan-out operation in which the ejection position is moved from the center portion of the substrate toward the peripheral edge portion thereof is performed.

Figure 4:
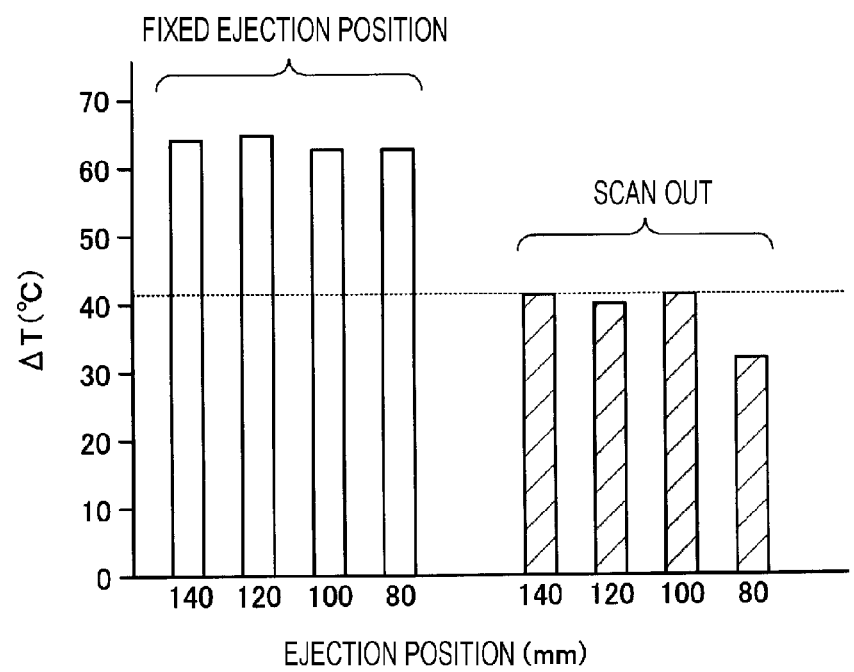
FIG. 4 is a graph illustrating a change in a temperature difference between a center portion and a peripheral edge portion of a wafer when an SPM that is set to an ejection temperature of 110° C. is ejected under a plurality of different ejection conditions, in the first embodiment.

FIG. 4 is a graph illustrating a change in a temperature difference between the center portion and the peripheral edge portion of the wafer W when the SPM that is set to the ejection temperature of 110° C. is ejected under a plurality of different ejection conditions. White columns illustrated in FIG. 4 illustrate experimental results when the SPM ejection position with respect to the surface of the wafer W is fixed at 80 mm, 100 mm, 120 mm, and 140 mm (the peripheral edge portion) in a case where the center of the wafer W is set to be 0 mm. Further, hatched columns illustrated in FIG. 4 illustrate experimental results when the SPM ejection position with respect to the surface of the wafer W is scanned out at 80 mm, 100 mm, 120 mm, and 140 mm.

As illustrated in FIG. 4, when the ejection position is fixed, the temperature difference ΔT (the temperature of the peripheral edge portion—the temperature of the center portion) exceeds 60° C. at any of the ejection positions, and the flapping of the wafer W occurs. Meanwhile, when the ejection position is scanned out, the temperature difference ΔT is below 42° C. at any of 80 mm, 100 mm, 120 mm, and 140 mm, and the flapping of the wafer W does not occur. From the above results, it is found out that the flapping of the wafer W occurs when the temperature difference ΔT between the center portion of the wafer W and the peripheral edge portion thereof exceeds 40° C.

Therefore, in the processing unit 16 according to the first embodiment, the substrate processing using the SPM is performed under the processing condition in which the temperature difference ΔT between the center portion of the wafer W and the peripheral edge portion thereof is 40° C. or less.

[Specific Operation of Processing Unit]

Figure 5:
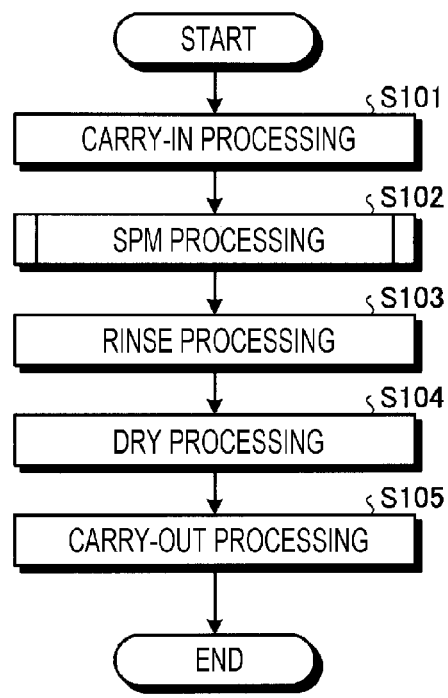
FIG. 5 is a flowchart illustrating a sequence of a substrate processing performed by the processing unit according to the first embodiment.

Subsequently, descriptions will be made on the contents of a substrate processing performed by the processing unit 16 according to the present embodiment with reference to FIG. 5. FIG. 5 is a flowchart illustrating a sequence of the substrate processing performed by the processing unit 16 according to the first embodiment. Each processing sequence illustrated in FIG. 5 is performed according to the control of the controller 18.

First, the processing unit 16 performs a carry-in processing of the wafer W (step S101). Specifically, the wafer W is carried into the chamber 20 (see FIG. 2) of the processing unit 16 by the substrate transfer device 17 (see FIG. 1), and held by the holding unit 31. Thereafter, the processing unit 16 rotates the holding unit 31 at a predetermined rotation speed (e.g., 50 rpm).

Next, the processing unit 16 performs an SPM processing (step S102). The details of the SPM processing will be described later.

When the SPM processing in step S102 is completed, the processing unit 16 performs a rinse processing (step S103). In the rinse processing, a rinse liquid (e.g., deionized water (DIW)) is supplied to the wafer W from a rinse liquid supply (not illustrated). The DIW supplied to the wafer W is spread over the surface of the wafer W by a centrifugal force attended by the rotation of the wafer W. Therefore, the SPM remaining on the wafer W is washed out with the DIW. In the rinse processing, the DIW heated to the temperature of the SPM or less may be supplied to the wafer W, and then, the DIW at the normal temperature may be supplied to the wafer W. Therefore, a rapid temperature change of the wafer W may be suppressed.

Next, the processing unit 16 performs a dry processing (step S104). In the dry processing, the wafer W is rotated at a predetermined rotation speed (e.g., 1,000 rpm) and for a predetermined period. Therefore, the DIW remaining on the wafer W is shaken off, and the wafer W is dried. Thereafter, the rotation of the wafer W is stopped.

Then, the processing unit 16 performs a carry-out processing (step S105). In the carry-out processing, the wafer W held by the holding unit 31 is delivered to the substrate transfer device 17. When the carry-out processing is completed, the substrate processing on one wafer W is completed.

[Regarding Sequence of SPM Processing]

Figure 6:
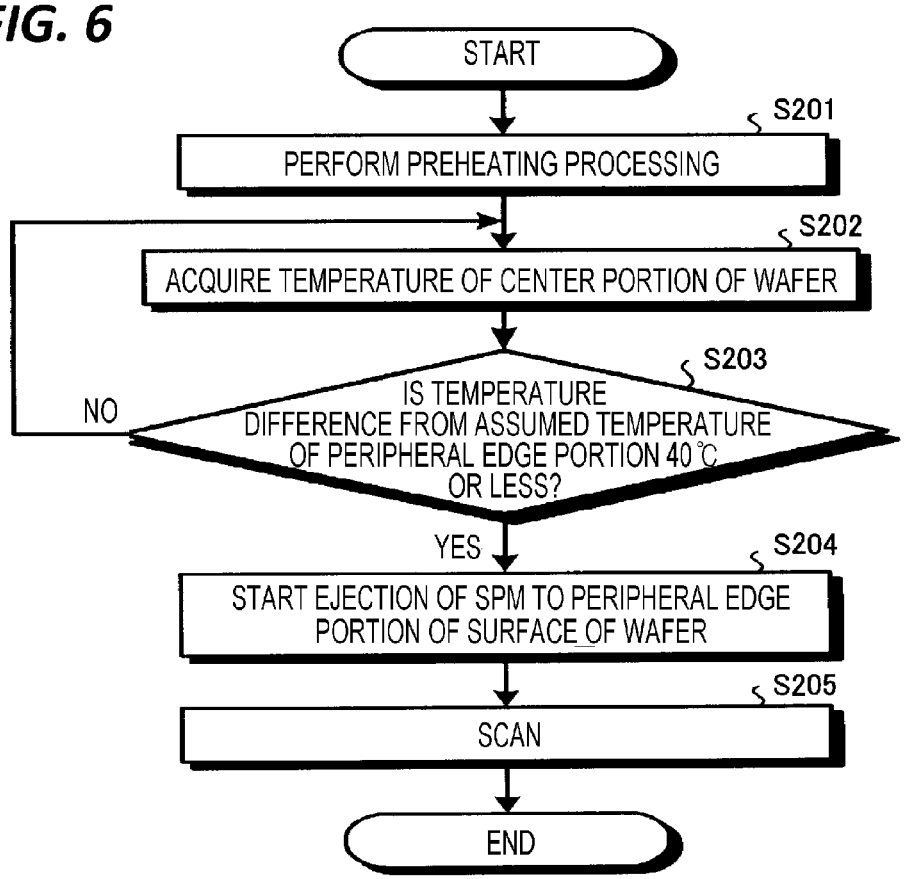
FIG. 6 is a flowchart illustrating a sequence of an SPM processing according to the first embodiment.
Figure 7:
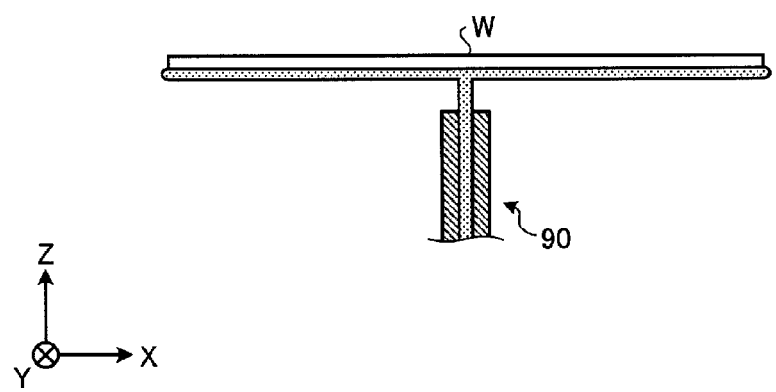
FIG. 7 is a view illustrating an example of an operation of the processing unit in the SPM processing.
Figure 8:
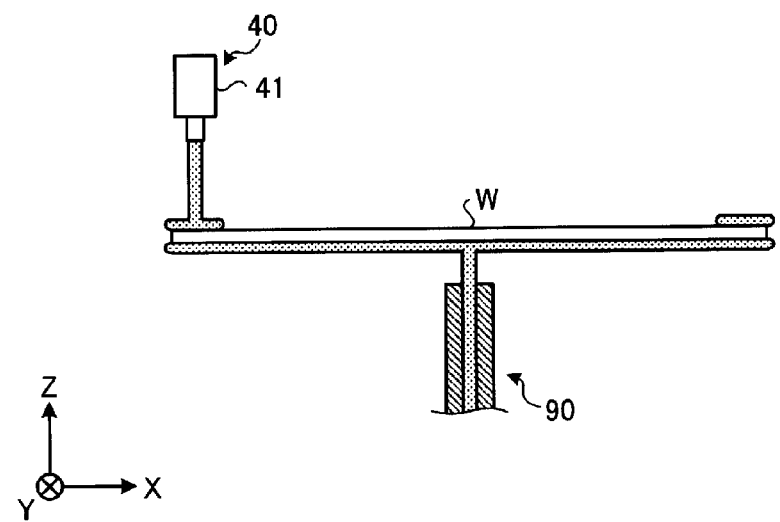
FIG. 8 is a view illustrating an example of an operation of the processing unit in the SPM processing.
Figure 9:
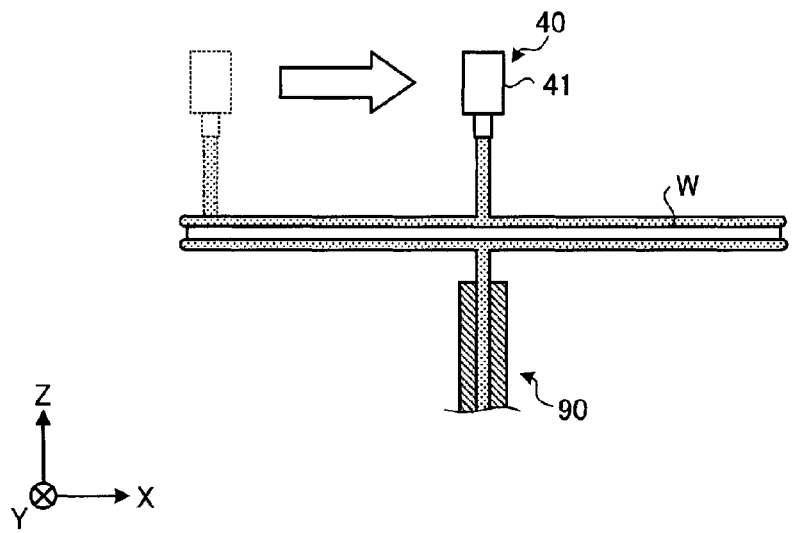
FIG. 9 is a view illustrating an example of an operation of the processing unit in the SPM processing.

Subsequently, descriptions will be made on a specific sequence of the SPM processing in step S102 with reference to FIGS. 6 to 9. FIG. 6 is a flowchart illustrating the sequence of the SPM processing according to the first embodiment. Further, FIGS. 7 to 9 are views illustrating an example of the operation of the processing unit in the SPM processing.

As illustrated in FIG. 6, in the SPM processing, firstly, a preheating processing is performed (step S201). In the preheating processing, the valve 304 and the valve 307 are opened for a predetermined period (e.g., 30 seconds), so that the SPM is supplied to the back surface center portion of the wafer W from the back surface supply 90. The SPM supplied to the wafer W is spread over the back surface of the wafer W by a centrifugal force attended by the rotation of the wafer W (see FIG. 7). Therefore, the temperature of the wafer W increases.

Next, the controller 18 acquires the temperature of the center portion of the wafer W from the temperature sensor 80 (step S202). Then, the controller 18 determines whether the temperature difference (the assumed temperature of the peripheral edge portion—the temperature of the center portion) between the temperature of the center portion of the wafer W acquired in step S202 and the assumed temperature of the peripheral edge portion thereof is 40° C. or less. Here, the assumed temperature of the peripheral edge portion is the temperature of the peripheral edge portion of the wafer W when assumed that the SPM is ejected to the peripheral edge portion of the surface of the wafer W. The assumed temperature of the peripheral edge portion is obtained by, for example, a preliminary experiment, and is stored in the storage unit 19.

When the difference from the assumed temperature of the peripheral edge portion is not 40° C. or less (No in step S203), the controller 18 returns the processing to step S202. Meanwhile, when the difference from the assumed temperature of the peripheral edge portion becomes 40° C. or less (Yes in step S203), the controller 18 controls the converting unit 309 to flow out the SPM to the surface supply 40. Therefore, the controller 18 starts the ejection of the SPM from the surface supply 40 to the peripheral edge portion of the surface of the wafer W (step S204 in FIG. 8).

Next, the controller 18 moves (scans) the nozzle 41 from the peripheral edge portion of the wafer W toward the center portion by controlling the moving mechanism 43 of the surface supply 40 (step S205). Therefore, the SPM is spread over the entire surface of the wafer W (see FIG. 9). In step S205, the controller 18 may stop the supply of the SPM from the surface supply 40 and the back surface supply 90 when the nozzle 41 reaches the center portion of the wafer W. Further, after the nozzle 41 reaches the center portion of the wafer W, the controller 18 may move the nozzle 41 to the peripheral edge portion of the wafer W again, and when the nozzle 41 reaches the peripheral edge portion of the wafer W, the controller may stop the supply of the SPM. Further, the controller 18 may move the nozzle 41 from one peripheral edge portion (e.g., the peripheral edge portion on the negative direction side of the X axis) of the wafer W to the other peripheral edge portion (e.g., the peripheral edge portion of the positive direction side of the X axis) via the center portion, and then, the controller 18 may stop the supply of the SPM.

As described above, according to the processing unit 16 according to the first embodiment, it is possible to suppress the flapping of the wafer W by ejecting the SPM to the peripheral edge portion of the surface of the wafer W, in the state where the difference from the assumed temperature of the peripheral edge portion is 40° C. or less. As a result, for example, it is possible to suppress, for example, the damage on the wafer W in the contact portion between the wafer W and the grasping units 31a. Further, since it is possible to perform the scan-in operation, the in-plane uniformity of the SPM processing may be improved.

Further, according to the processing unit 16 according to the first embodiment, in the preheating processing, the center portion of the wafer W is heated by supplying the SPM to the back surface of the wafer W, and thus, for example, the center portion of the wafer W may be heated without preparing a heating mechanism separately. Further, it is possible to share the SPM ejected from the surface supply 40 and a drain system. Further, since the temperature conditions are the same as the SPM ejected from the surface supply 40, the temperature control is easy.

Second Embodiment

Figure 10:
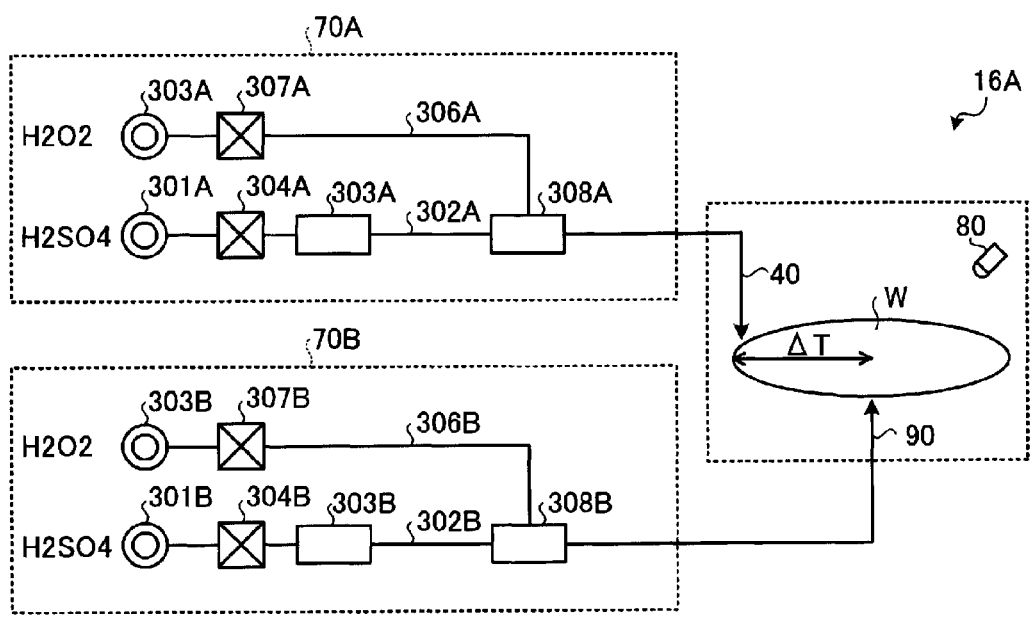
FIG. 10 is a view illustrating a configuration of an SPM supply mechanism according to a second embodiment.

FIG. 10 is a view illustrating a configuration of an SPM supply mechanism according to a second embodiment. As illustrated in FIG. 10, a processing unit 16A according to the second embodiment is provided with a first SPM supply mechanism 70A that supplies the SPM to the surface supply 40, and a second SPM supply mechanism 70B that supplies the SPM to the back surface supply 90.

The first SPM supply mechanism 70A includes a sulfuric acid supply source 301A, a sulfuric acid supply path 302A, a temperature adjusting unit 303A, and a valve 304A as a sulfuric acid supply system. Further, the first SPM supply mechanism 70A includes a hydrogen peroxide supply source 305A, a hydrogen peroxide supply path 306A, and a valve 307A as a hydrogen peroxide supply system. Further, the first SPM supply mechanism 70A includes a mixing unit 308A.

Further, the second SPM supply mechanism 70B includes a sulfuric acid supply source 301B, a sulfuric acid supply path 302B, a temperature adjusting unit 303B, and a valve 304B as a sulfuric acid supply system. Further, the second SPM supply mechanism 70B includes a hydrogen peroxide supply source 305B, a hydrogen peroxide supply path 306B, and a valve 307B as a hydrogen peroxide supply system. Further, the second SPM supply mechanism 70B includes a mixing unit 308B.

According to the processing unit 16A, it is possible to supply SPM mixed at different mixing ratios to the surface and the back surface of the wafer W. Therefore, the controller 18 may supply the SPM, mixed at a mixing ratio at which the reaction temperature becomes higher than the SPM ejected to the surface of the wafer W, to the back surface of the wafer W, by controlling the mixing units 308A and 308B. In this manner, even if the temperature difference is not 40° C. or less even when supplying the SPM at the same temperature, the temperature difference may become 40° C. or less.

Figures 11, 12:
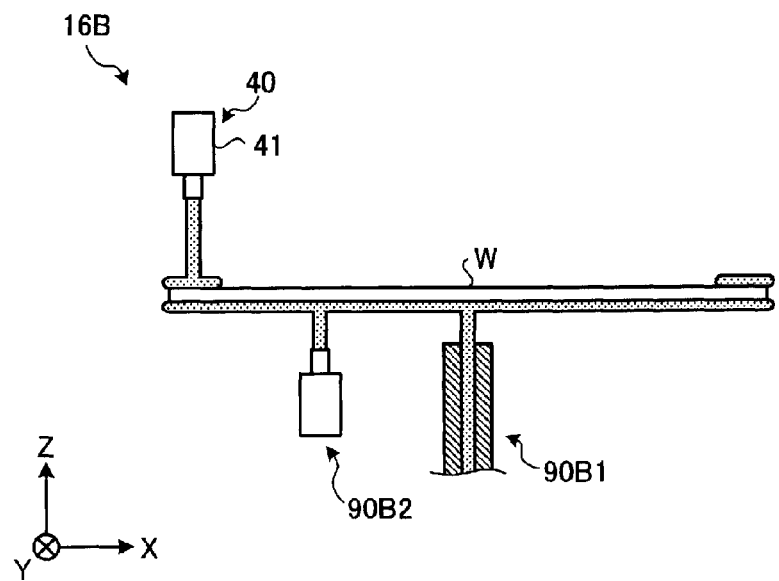
FIG. 11 is a view illustrating an example of a relationship between an ejection position of an SPM to a surface of a wafer and a mixing ratio of an SPM ejected to a back surface of the wafer.
FIG. 12 is a view illustrating a configuration of a processing unit according to a third embodiment.

Further, the controller 18 may change the mixing ratio of the SPM supplied to the back surface of the wafer W according to the SPM ejection position to the surface of the wafer W. Descriptions will be made on an example in this case with reference to FIG. 11. FIG. 11 is a view illustrating an example of a relationship between the SPM ejection position to the surface of the wafer W and the mixing ratio of the SPM ejected to the back surface of the wafer W.

As illustrated in FIG. 11, the temperature of the peripheral edge portion of the wafer W decreases as the SPM ejection position to the surface of the wafer W approaches the center portion by the scan-in operation. For example, by moving the SPM ejection position to the surface of the wafer W from 140 mm (the peripheral edge portion) to 0 mm (the center portion), the temperature of the peripheral edge portion of the wafer W gradually decreases 130° C., 128° C., and 126° C. It is because, as the SPM ejection position moves away from the peripheral edge portion of the wafer W, the temperature decrease of the SPM occurring before reaching the peripheral edge portion increases.

Therefore, the controller 18 may match the target temperature of the SPM ejected to the back surface of the wafer W to the temperature of the peripheral edge portion of the wafer W, by controlling the target temperature of the SPM ejected to the back surface of the wafer W to be low as the SPM ejection position to the surface of the wafer W approaches the center portion.

The controller 18 may change the temperature of the SPM ejected to the back surface of the wafer W by changing the mixing ratio of the SPM ejected to the back surface of the wafer W.

For example, the storage unit 19 may store in advance mixing ratio information indicating the relationship between the SPM ejection position to the surface of the wafer W and the mixing ratio of the SPM ejected to the back surface of the wafer W. In this case, the controller may appropriately change the mixing ratio of the SPM ejected to the back surface of the wafer W, by controlling the mixing unit 308B according to the SPM ejection position to the surface of the wafer W and the mixing ratio information. The SPM ejection position to the surface of the wafer W may be calculated based on, for example, the elapsed time after starting the scan-in operation and the moving speed of the nozzle 41, or may be acquired by a sensor provided in, for example, the moving mechanism 43 of the surface supply 40.

Without being limited to the above example, the controller 18 may change the mixing ratio of the SPM ejected to the back surface of the wafer W, by acquiring, for example, the temperature of the peripheral edge portion of the wafer W from the temperature sensor 80, and controlling the mixing unit 308B according to the acquired temperature of the peripheral edge portion.

Further, the controller 18 may acquire the temperature of the peripheral edge portion of the wafer W and the temperature of the center portion from the temperature sensor 80, and change the mixing ratio of the SPM ejected to the back surface of the wafer W such that the temperature of the center portion is close to the temperature of the peripheral edge portion.

Third Embodiment

FIG. 12 is a view illustrating a configuration of a processing unit according to a third embodiment. As illustrated in FIG. 12, a processing unit 16B according to the third embodiment is provided with a first back surface supply 90B1 and a second back surface supply 90B2.

The first back surface supply 90B1 ejects the SPM to the back surface center portion of the wafer W. The second back surface supply 90B2 ejects the SPM to a position outside in the radial direction of the wafer W from the back surface center portion of the back surface of the wafer W, that is, a position closer to the peripheral edge portion of the wafer W. For example, the first back surface supply 90B1 ejects the SPM to an intermediate point between the center portion and the peripheral edge portion of the back surface of the wafer W.

As described above, by providing the second back surface supply 90B2, for example, even when the temperature difference between the peripheral edge portion and the center portion of the wafer W is not 40° C. or less by only the first back surface supply 90B1, the temperature difference may become 40° C. or less. Further, since it is possible to heat the wafer W more uniformly, the in-plane uniformity of the SPM processing may be improved.

The processing unit 16B may include an SPM supply mechanism that is common to the first back surface supply 90B1 and the second back surface supply 90B2, or may include an SPM supply mechanism for each of the first back surface supply 90B1 and the second back surface supply 90B2.

OTHER EMBODIMENTS

In the respective embodiments described above, in the preheating processing, the wafer W is heated by supplying the SPM to the back surface of the wafer W. The present disclosure is not limited thereto, and in the preheating processing, the wafer W may be heated by ejecting a heating fluid other than the SPM to the back surface of the wafer W. As the heating fluid other than the SPM, for example, in addition to heated DIW, a heated gas (e.g., an inert gas such as $N_2$ gas or air) may be used.

Further, in the respective embodiments described above, descriptions have been made on the example in which the surface of the wafer W is the processing target surface. The present disclosure is not limited thereto, and the processing target surface may be the back surface of the wafer W. In this case, in the preheating processing, the center portion of the surface of the wafer W is heated, and then, the SPM may be ejected to the peripheral edge portion of the back surface of the wafer W.

As described above, the substrate processing apparatus (e.g., the processing units 16, 16A, and 16B) according to the embodiment is provided with a holding unit (e.g., holding unit 31), an opposite surface ejector (e.g., the back surface supply 90, the first back surface supply 90B1, and the second back surface supply 90B2), a processing target surface ejector (e.g., the surface supply 40), and a moving mechanism (e.g., the moving mechanism 43). The holding unit holds a substrate (e.g., the wafer W). The opposite surface ejector ejects the SPM that is a mixed solution of sulfuric acid and hydrogen peroxide to a center portion of an opposite surface (e.g., the back surface of the wafer W) that is a surface on a side opposite to the processing target surface (e.g., the surface of the wafer W) of the substrate. The processing target surface ejector ejects the SPM that is a mixed solution of sulfuric acid and hydrogen peroxide to a peripheral edge portion of the processing target surface.

The moving mechanism moves the processing target surface from the peripheral edge portion of the processing target surface to the center portion.

Therefore, since the center portion of the substrate may be heated in advance by the SPM ejected from the opposite side ejector, when the SPM is ejected to the peripheral edge portion of the processing target surface of the substrate from the processing target surface ejector, the temperature difference between the center portion and the peripheral edge portion of the substrate may be made hard to occur. Therefore, flapping of the substrate may be suppressed in a substrate processing using the SPM, particularly, in a case in which the substrate is processed while moving the SPM ejection position from the peripheral edge portion of the substrate to the center portion thereof.

Further, the substrate processing apparatus (e.g., the processing unit 16A) according to the embodiment may be provided with a first SPM supply mechanism (e.g., the first SPM supply mechanism 70A), and a second SPM supply mechanism (e.g., the second SPM supply mechanism 70B). The first SPM supply mechanism includes a first mixing unit (e.g., the mixing unit 308A) capable of changing a mixing ratio of sulfuric acid and hydrogen peroxide, and supplies an SPM mixed in the first mixing unit to the processing target surface ejector. The second SPM supply mechanism includes a second mixing unit (e.g., the mixing unit 308B) capable of changing a mixing ratio of sulfuric acid and hydrogen peroxide, and supplies an SPM mixed in the second mixing unit to the opposite surface ejector.

Therefore, it is possible to supply an SPM mixed respectively at different mixing ratios to the processing target surface and the opposite surface of the substrate. Therefore, for example, it is possible to supply the SPM, mixed at a mixing ratio at which a reaction temperature is higher than the SPM ejected to the processing target surface of the substrate, to the opposite surface of the substrate. In this manner, even if the temperature difference between the center portion and the peripheral edge portion of the substrate may not be reduced sufficiently even when supplying the SPM at the same temperature, the temperature difference may be sufficiently reduced.

The opposite ejector may include a first ejector (e.g., the first back surface supply 90B1) that ejects a first SPM to the center portion of the opposite surface, and a second ejector (e.g., the second back surface supply 90B2) that ejects a second SPM to a position outside in a radial direction of the substrate from the center portion of the opposite surface.

By providing the second ejector, for example, even when the temperature difference between the peripheral edge portion and the center portion of the substrate may not be reduced sufficiently with only the first ejector, the temperature difference may be sufficiently reduced. Further, since it is possible to heat the substrate more uniformly, the in-plane uniformity of the substrate processing using the SPM may be improved.

According to the present disclosure, it is possible to suppress the flapping of the substrate in the substrate processing using the SPM.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   storing a temperature of a peripheral edge portion of a substrate obtained by a preliminary experiment in a storage by a processor;
   holding a substrate having a processing target surface and an opposite surface which is opposite to the processing target surface;
   first ejecting a sulfuric acid hydrogen peroxide mixture (SPM) to a center portion of the opposite surface of the substrate to preheat the substrate;
   acquiring a temperature of the preheated center portion of the substrate using a temperature sensor positioned above the substrate after the first ejecting;
   determining a temperature difference between the temperature of the peripheral edge portion of the substrate stored in the storing and the temperature of the preheated center portion of the substrate acquired in the acquiring;
   second ejecting the SPM to a peripheral edge portion of the processing target surface of the substrate when the temperature difference is 40° C. or less, after completing the first ejecting after the acquiring; and
   moving an ejection position of the SPM in the second ejecting from the peripheral edge portion of the processing target surface to a center portion of the processing target surface of the substrate,
   wherein the preliminary experiment includes ejecting the SPM to the peripheral edge portion of the substrate and measuring the temperature of the peripheral edge portion of the substrate.

2. The substrate processing method according to claim 1, wherein the SPM ejected to the opposite surface of the substrate in the first ejecting is obtained by mixing sulfuric acid and hydrogen peroxide at a mixing ratio that causes a reaction temperature to be higher than the SPM ejected to the processing target surface in the second ejecting.

3. The substrate processing method according to claim 2, further comprising:
   changing the mixing ratio of the SPM ejected in the first ejecting to the opposite surface of the substrate according to a change of an SPM ejection position with respect to the processing target surface in the moving.

4. The substrate processing method according to claim 3, wherein, in the first ejecting, a first SPM is ejected to the center portion of the opposite surface of the substrate, and a second SPM is ejected to a position of the substrate radially outside the center portion of the opposite surface.

5. The substrate processing method according to claim 1, further comprising:
   changing a mixing ratio of the SPM ejected in the second ejecting to the opposite surface of the substrate according to a change of an SPM ejection position with respect to the processing target surface in the moving.

* * * * *